US012648287B2

(12) United States Patent
Lederer et al.

(10) Patent No.: US 12,648,287 B2
(45) Date of Patent: Jun. 2, 2026

(54) SOLAR CELL

(71) Applicant: Novaled GmbH, Dresden (DE)

(72) Inventors: Kay Lederer, Dresden (DE); Steffen Runge, Dresden (DE); Hendrik Bolink, Moncada (ES); Michele Sessolo, Valencia (ES); Jorge Avila, Valencia (ES); Maria Grazia La Placa, Valencia (ES); Pablo B. Boix, Valencia (ES)

(73) Assignee: Novaled GmbH, Dresden (DE)

( * ) Notice: Subject to any disclaimer, the term of this patent is extended or adjusted under 35 U.S.C. 154(b) by 97 days.

(21) Appl. No.: 18/680,234

(22) Filed: May 31, 2024

(65) Prior Publication Data

US 2026/0024707 A1     Jan. 22, 2026

Related U.S. Application Data

(62) Division of application No. 16/459,789, filed on Jul. 2, 2019, now Pat. No. 12,033,811.

(51) Int. Cl.
| | |
|---|---|
| *H10K 30/30* | (2023.01) |
| *H01G 9/20* | (2006.01) |
| *H10K 30/80* | (2023.01) |
| *H10K 85/50* | (2023.01) |
| *H10K 30/84* | (2023.01) |

(52) U.S. Cl.
CPC ......... *H10K 30/353* (2023.02); *H01G 9/2009* (2013.01); *H10K 30/30* (2023.02); *H10K 30/80* (2023.02); *H10K 85/50* (2023.02); *H10K 30/84* (2023.02)

(58) Field of Classification Search
CPC ...... H01G 9/2009; H10K 30/30; H10K 30/80; H10K 30/353; H10K 85/50; H10K 30/84; H10K 85/211; Y02E 10/542; Y02E 10/549
See application file for complete search history.

(56) References Cited

U.S. PATENT DOCUMENTS

| | | | |
|---|---|---|---|
| 2010/0243038 A1 | 9/2010 | Kukulka | |
| 2011/0011453 A1* | 1/2011 | Kang | ...................... H10F 19/31 |
| | | | 438/57 |

(Continued)

FOREIGN PATENT DOCUMENTS

| | | |
|---|---|---|
| CN | 107141243 A | 9/2017 |
| EP | 2738230 A1 | 6/2014 |

(Continued)

OTHER PUBLICATIONS

Notice of Reasons for Refusal issued in Japan application No. 2019-123701, dated Mar. 22, 2023 (14 pages).
(Continued)

*Primary Examiner* — Michael Y Sun
(74) *Attorney, Agent, or Firm* — Eversheds Sutherland (US) LLP

(57) ABSTRACT

The present invention is related to a solar cell comprising a first electrode; a second electrode; and a stack of layers provided between the first electrode and the second electrode; wherein the stack of layers comprises one light absorbing layer provided with a perovskite crystal structure; and at least one dopant layer, wherein the dopant layer consists of one or more n-dopant material(s); or one or more p-dopant material(s).

13 Claims, 5 Drawing Sheets

(56)  References Cited

U.S. PATENT DOCUMENTS

| | | |
|---|---|---|
| 2015/0090314 A1 | 4/2015 | Yang et al. |
| 2016/0049603 A1* | 2/2016 | Kleemann .............. H10K 10/84 |
| | | 257/40 |
| 2016/0380125 A1 | 12/2016 | Snaith et al. |

FOREIGN PATENT DOCUMENTS

| | | | |
|---|---|---|---|
| JP | 2007080600 A | 3/2007 | |
| JP | 2012527089 A | 11/2012 | |
| JP | 2014131014 A | 7/2014 | |
| JP | 2016529737 A | 9/2016 | |
| JP | 2017126676 A | 7/2017 | |
| JP | 2018037534 A | 3/2018 | |
| JP | 2018120846 A | 8/2018 | |
| JP | 2019016788 A | 1/2019 | |
| TW | 201725746 A | 7/2017 | |
| WO | WO-2017191265 A1 * | 11/2017 | .............. H10K 85/50 |
| WO | 2019053968 A1 | 3/2019 | |
| WO | 2019072928 A1 | 4/2019 | |

OTHER PUBLICATIONS

Notice of Reasons for Refusal issued in Japan application No. 2019-123701, dated Oct. 31, 2023 (10 pages).

Office Action issued in Taiwan application No. 108123251, mailed Mar. 13, 2023 (5 pages).

Stranks, et al., "Electron-Hole Diffusion Lengths Exceeding 1 Micrometer in an Organometal Trihalide Perovskite Absorber," Science (2013), vol. 342, pp. 341-344.

Pellet, et al., "Mixed-Organic-Cation Perovskite Photovoltaics for Enhanced Solar-Light Harvesting," Angew Chem. Int. Ed. (2014), vol. 53, pp. 3151-3157.

Polander, et al., "Hole-Transport Material Variation in Fully Vacuum Deposited Perovskite Solar Cells," APL Materials (2014), vol. 2, pp. 081503-1-081503-5.

Raga, et al., "Rapid Perovskite Formation by $CH_3NH_2$ Gas-Induced Intercalation and Reaction of $PbI_2$," Journal of Materials Chemistry A. (2016), vol. 4, pp. 2494-2500.

Zhou, et al., "Interface Engineering of Highly Efficient Perovskite Solar Cells," Reports Photovoltaics, Sciencemag. org, Science (2014), vol. 345, Issue (6196), pp. 542-546.

Wu, et al., "High Efficiency Stable Inverted Perovskite Solar Cells Without Current Hysteresis," Journal of the Royal Society of Chemistry (2015), vol. 8, pp. 2725-2733.

Yang, et al., "High-Performance Photovoltaic Perovskite Layers Fabricated Through Intramolecular Exchange," Science (2015), vol. 348, Issue (6240), pp. 1234-1237.

Bi, et al., "Efficient Luminescent Solar Cells Based on Tailored Mixed-Cation Perovskites," Sci. Adv. (2016):2, pp. 1-7.

Chen, et al., "Planar Heterojunction Perovskite Solar Cells via Vapor-Assisted Solution Process," J. Am. Chem. Soc. (2014), vol. 136, pp. 622-625.

Chen, et al., "Efficient and Stable Large-Area Perovskite Solar Cells with Inorganic Charge Extraction Layers," Science (2015), vol. 350, Issue (6263), pp. 944-948.

Conings, et al., "Perovskite-Based Hybrid Solar Cells Exceeding 10% Efficiency with High Reproducibility Using a Thin Film Sandwich Approach," Adv. Mater. (2014), vol. 26, pp. 2041-2046.

Abdi-Jalebi, et al., "Charge Extraction via Graded Doping of Hole Transport Layers Gives Highly Luminescent and Stable Metal Halide Perovskite Devices," Sc. Adv. (2019), vol. 5, pp. 1-9.

Eperon, et al., "Morphological Control for High Performance, Solution-Processed Planar Heterojunction Perovskite Solar Cells," Adv. Funct. Mater. (2014), vol. 24, pp. 151-157.

Jeon, et al., "Compositional Engineering of Perovskite Materials for High-Performance Solar Cells," Nature (2015), vol. 517. pp. 476-500.

Ke, et al., "Efficient Fully-Vacuum-Processed Perovskite Solar Cells Using Copper Phthalocyanine as Hole Selective Layers," J. Mater. Chem. (2015), vol. 3, pp. 23888-23894.

Kojima, et al., "Organometal Halide Perovskites as Visible-Light Sensitizers for Photovoltaic Cells," J. Am. Chem. Soc. (2009), vol. 131. pp. 6050-6051.

Nie, et al., "High-Efficiency Solution-Processed Perovskite Solar Cells with Millimeter-Scale Grains," Science (2015), vol. 347, Issue (6221), pp. 522-525.

Kim, et al., "Fully Vacuum-Processed Perovskite Solar Cells with High Open Circuit Voltage Using $MoO_3$/NPB as Hole Extraction Layers," Elsevier (2015), vol. 17, pp. 102-106.

Lee, et al., "Efficient Hybrid Solar Cells Based on Meso-Superstructured Organometal Halide Perovskites," Science (2012), vol. 338, pp. 643-646.

Li, et al., "Metal Organic Framework Doped Spiro-OMeTAD with Increased Conductivity for Improving Perovskite Solar Cell Performance," Solar Energy 188 (2019), pp. 380-385.

Avila et al., "Influence of Doped Charge Transport Layers on Efficient Perovskite Solar Cells," Sustainable Energy Fuels, 2018, 2:2429-2434.

Avila et al., "Influence of Doped Charge Transport Layers on Efficient Perovskite Solar Cells," Electronic Supplementary Material (ES) for Sustainable Energy & Fuels, 2018, 7 pages.

Britannica Academic "dopant", Encyclopedia Britannica, Jun. 2, 2020, academic.eb.com/levels/collegiate/article/dopant/30952, Accessed Oct. 23, 2020 (2020).

Momblona et al., Efficient vacuum deposited p-i-n and n-i-p perovskite solar cells employing doped charge transport layers, Energy Environ. Sci., 2016, 9, 3456 (2016).

SciFindern (Substance Detail CAS Registry No. 952431-34-4, 2021) (2021).

* cited by examiner

SOLAR CELL

CROSS-REFERENCE TO RELATED APPLICATIONS

This application is a divisional of U.S. application Ser. No. 16/459,789, filed Jul. 2, 2019, the content of which is hereby incorporated by reference herein.

The present disclosure relates to a solar cell.

BACKGROUND

Thin-film photovoltaic is a key technology among future low cost and sustainable renewable energy sources. Organic-inorganic (hybrid) lead halide perovskite solar cells have been proposed for photovoltaic applications because of their impressive power conversion efficiencies (PCEs), now exceeding 21%. (see Kojima et al., J. Am. Chem. Soc. 131, 6050-6051 (2009); Lee et al., Science 338, 643-647 (2012); Yang et al., Science 348, 1234-1237 (2015)). The perovskite thin-film absorber can be deposited by simple solution or sublimation methods, hence with a large potential for the preparation of inexpensive photovoltaic devices. The high PCEs are the result of the very high absorption coefficient and mobilities of the photogenerated electrons and holes of hybrid perovskites.

In order to prepare high performance solar cells, homogeneous perovskite films with a high degree of crystallinity are needed in order to reduce the trap concentration and achieve an adequate mobility of the charge carriers (see Nie et al., Science 347, 522-525 (2015)). While the use of the archetype perovskite, methylammonium lead iodide (MAPbI$_3$), can lead to high efficiency devices, a further decrease of the bandgap by incorporation of formamidinium (FA), allows for the harvesting of additional near-infrared photons (see Pellet et al., Angewandte Chemie International Edition 53, 3151-3157 (2014)). When such a mixed organic cation perovskite is further stabilized by replacing part of the iodide with bromide, the champion material for perovskite cells, (FAPbI$_3$)$_{1-x}$(MAPbBr$_3$)$_x$, is obtained (see Yang et al., Science 348, 1234-1237 (2015); Jeon et al., Nature 517, 476-480 (2015); Bi et al., Science Advances 2 (2016)).

Different solar cell architectures have been used. One of them derives from dye-sensitized solar cells, and consists of a transparent conductive substrate coated with a mesoporous or planar TiO$_2$ layer (n-type, hence acting as the electron transport layer, ETL) into or onto which the perovskite light absorbing layer is applied. A hole transport layer (HTL, p-type), usually consisting of organic semiconductors is then deposited from solution on top of the perovskite and the device is finished with an evaporated top electrode (see Stranks et al., Science 342, 341-344 (2013); Eperon et al., Advanced Functional Materials 24, 151-157 (2014); Conings et al., Advanced Materials 26, 2041-2046 (2014); and Chen et al., Journal of the American Chemical Society 136, 622-625 (2014)).

Another configuration is inverted compared to the above mentioned one, and the conductive substrate is coated with a HTL, followed by the perovskite absorber and an ETL, coated with a suitable evaporated top electrode (see Wu et al., Energy & Environmental Science 8, 2725-2733 (2015); Zhou et al., Science 345, 542-546 (2014). While these two device configuration have been identified as "conventional" and "inverted", such devices may rather be referred to as n-i-p device and p-i-n device.

Chen et al. (Science 350, 944-948 (2015)) demonstrated that the PCE in planar devices may be limited by the conductivity of the metal oxide layers, which can be increased by doping these layers. This was achieved by incorporating heteroatoms with different valences into the solution processed metal oxides, although leading only to a small increase in the conductivity (approximately one order of magnitude). Thus, only very thin metal oxide transport layers (<20 nm) could be used otherwise PCE would drop significantly.

Most reported organic-inorganic (hybrid) lead halide perovskite solar cells that are employing a vacuum deposited perovskite light absorbing layer do then employ charge transport layers processed from solution. Fully vacuum processed solar cell devices would offer the additional advantage of being compatible with temperature sensitive substrates, allowing for conformal coatings on non-planar substrates and for the straightforward implementation into tandem solar cells (see Polander et al., APL Materials 2, 081503 (2014)). Besides the high sophistication level of the deposition systems required for vacuum processing, they have been implemented in the electronic industry since long demonstrating high throughput and reliability (Ono et al., Journal of Materials Chemistry A (2016)).

By selecting certain hole transport molecules with regard to the energy levels of the conduction and valence band of the perovskite, open circuit voltages (Voc) as high as 1.1 V were demonstrated (Polander et al., APL Materials 2, 081503 (2014); Kim et al., Organic Electronics 17, 102-106 (2015), Ono et al., Journal of Materials Chemistry A (2016)). The highest efficiency (15.4%) was measured for a device with rather high hysteresis (14.0% PCE was obtained for the same cell measured in the opposite bias scan direction), which used single layers of undoped organic molecules as the charge extraction layers (see Ke et al., Journal of Materials Chemistry A 3, 23888-23894 (2015)).

EP 3 242 340 A1 discloses solar cells having a first electrode, a second electrode and a stack of layers provided between the first and the second electrode. The stack of layers comprises a light absorbing layer comprising an absorber compound provided with a perovskite crystal structure. It is further disclosed that a p-type dopant layer is provided between the first electrode and the light absorbing layer and that, at the same time, an n-type dopant layer is provided between the light absorbing layer and the second electrode.

State of the art solar cells may suffer from low open-circuit voltage, low short-circuit current, low efficiency, short lifetime and/or low fill factor.

SUMMARY

It is, therefore, an object of the present invention to provide a solar cell overcoming drawbacks of the prior art, in particular, to provide a solar cell having improved power conversion efficiency and, at the same, improved stability and life time. It is a further object to provide a solar cell with high rectifications resulting in a high fill factor.

The above objects are achieved by a solar cell comprising a first electrode; a second electrode; and a stack of layers provided between the first electrode and the second electrode; wherein the stack of layers comprises one light absorbing layer provided with a perovskite crystal structure; and at least one dopant layer, wherein the at least one dopant layer consists of one or more n-type dopant material(s); or one or more p-type dopant material(s). In one embodiment there may be a number of the same type of dopant layer, either n-type or p-type, provided in the same stack of layers.

In context of the present invention if it is referred to "at least one dopant layer" all of the respective layers are addressed if not explicitly mentioned else.

According to the invention, the stack of layers comprises one light absorbing layer and at least one dopant layer. In this regard, it has to be understood that the stack of layers comprises exactly one light absorbing layer (and not two or more light absorbing layers) and exactly one type of dopant layer, either n-type or p-type. In other words, in case that the stack of layers which is comprised in the solar cell of claim 1 comprises only one dopant layer, it is provided that this dopant layer is either of the n-type or of the p-type. In case that the layer stack which is comprised in the solar cell comprises two or more dopant layers it is provided that either (first alternative) all dopant layers comprised in the single stack of layers are of the n-type, i.e. are all formed by one or more n-type dopant materials, or (second alternative) are all of the p-type, i.e. are all formed of one or more p-type dopant materials.

In one embodiment, the stack of layer comprises one light absorbing layer and one dopant layer.

In another embodiment, the stack of layers comprises one light absorbing layer and two or more dopant layers, wherein the two or more dopant layers are all either of the n-type or of the p-type, i.e. are all either formed by one or more n-type dopant materials or are all formed by one or more p-type dopant materials.

In a first alternative, the at least one dopant layer consists of one or more n-type dopant material(s). In a second alternative, the dopant layer consists of one or more p-type dopant material(s). In this regard "consisting of" means that the dopant layer exclusively contains one type of dopant material, i.e. either a single n-type dopant materials/a mixture of different n-type dopant materials or, alternatively, one single p-type dopant material/a mixture of different p-type dopant materials but not a mixture of n-type dopant materials together with p-type dopant materials or of the respective dopant materials with other materials.

In particular, it may be provided that the at least one dopant layer is free of any charge transport materials. Exemplary respective charge transport materials are disclosed herein but are not limited thereto.

In an embodiment where the layer stack which is comprised in the solar cell comprises two or more dopant layers it is provided that the two or more dopant layers are separated by layers consisting of charge transport materials. In this embodiment the dopant layer is in direct contact with the adjacent layer consisting of charge transport materials. These layers of charge transport materials are free of n-type dopants and free of p-type dopants. The use of such layers of charge transport materials may increase the power conversion efficiency of a solar cell or the stability and life time of a solar cell according to this invention.

In another embodiment it is provided that the dopant layer and the electrode are separated by a layer consisting of charge transport materials. In this embodiment the layer consisting of charge transport materials is in direct contact with the adjacent dopant layer on the one side and with the electrode on the other side. The layer of charge transport materials is free of n-type dopants and free of p-type dopants. The use of such layer of charge transport materials may increase the power conversion efficiency of a solar cell or the stability and life time of a solar cell according to this invention.

In another embodiment it is provided that the dopant layer and the light absorbing layer are separated by a layer consisting of charge transport materials. In this embodiment the layer consisting of charge transport materials is in direct contact with the adjacent dopant layer on the one side and with the light absorbing layer on the other side. The layer of charge transport materials is free of n-type dopants and free of p-type dopants. The use of such layer of charge transport materials may increase the power conversion efficiency of a solar cell or the stability and life time of a solar cell according to this invention.

Besides the one light absorbing layer and the at least one dopant layer the stack of layers may contain a variety of further layers.

According to the invention, if an n-type dopant layer is present in the (single) stack of layers, a p-type dopant layer is not present in the same stack of layers. If a p-type dopant layer is present in the stack of layers, then the n-type is not present in the same stack of layers. That is, the presence of further types of pure dopant layers in a single stack of layers-besides the at least one dopant layer—is excluded.

It was surprisingly found by the inventors that the insertion of one type of thin dopant layer between the electrode and the perovskite absorber layer increases the power conversion efficiency of a solar cell and, at the same time, the stability and life time is notably improved.

Furthermore, it was surprisingly found by the inventors that the use of only one type of dopant layer in the same layer stack as referred to herein only on one side of the light absorber layer in the same layer stack leads to diodes with high rectifications, as evidenced by a high fill factor. The generic architectures identified herein can yield very efficient and rather stable solar cells and might be used in a wide range of planer type perovskite solar cells and multi-junction architectures.

A solar cell comprises a first electrode and a second electrode and at least one stack of layers provided between the first electrode and the second electrode. The at least one stack of layers comprises a first light absorbing layer provided which may have a layer thickness of about 200 nm to about 700 nm, and comprises an absorber compound provided with a perovskite crystal structure.

In one embodiment, it may be provided that the at least one dopant layer may contain two or more dopant sub-layers wherein all of the dopant sub-layers are of the same type (either p-type or n-type) as the at least one dopant layer. That is, if the at least one dopant layer consists of one or more n-type dopant materials, all dopant sub-layers consist of n-type dopant materials which may be the same or different from each other. Likewise, in case that the at least one dopant layer consists of one or more p-type dopant materials each dopant sub-layer which may be comprised in the at least one dopant layer consists of one or more p-type dopant materials which may be selected the same or different from each other.

The inventive solar cell may contain only one stack of layers. In alternative embodiments, the solar cell may contain two or more different stacks of layers. A stack of layers in accordance with the present invention is a layer stack containing exactly one light absorbing layer and exactly one type of dopant layer, wherein the at least one dopant layer in the stack of layers consists of one or more n-type dopant material(s); or, alternatively, one or more p-type dopant material(s). In the embodiment where the solar cell comprises two or more different stacks of layers, it may be provided that all of the stacks of layers contain the same type of the at least one dopant layers (for example only n-type or only p-type) or that the stacks each individually contain a different type of the at least one dopant layer.

In case that the solar cell contains more than one stack of layers, the different stacks of layers may be separated from each other and connected with each other by interconnecting layers wherein an interconnecting layer is arranged between the first electrode and the second electrode and a first stack of layers and a second stack of layer and in direct contact with both stacks of layers. Respective interlayers and materials for forming the same are well-known from the prior art, for example WO2007/071451 A1, WO08/077615 A1 or WO2010/132236 A1. The interconnecting layer in terms of the present disclosure is not the at least one dopant layer.

In one embodiment the at least one dopant layer is arranged between the first electrode and the light absorbing layer.

In one further embodiment the at least one dopant layer is arranged between the second electrode and the light absorbing layer.

In a further embodiment the at least one dopant layer is in direct contact with the first electrode.

In one embodiment the at least one dopant layer is in direct contact with the second electrode.

In one further embodiment the at least one dopant layer is in direct contact with the light absorbing layer.

In a further embodiment the solar cell comprises two or more layer stacks and optionally at least one interconnecting layer, wherein the interconnecting layer is arranged between two of the different stacks of layers.

In one embodiment the p-type dopant material is an organic, a metal-organic or an organo-metallic compound, wherein the total amount of electron withdrawing groups in the organic, metal-organic or organo-metallic compound is from 17 atomic percent to 90 atomic percent, wherein the electron withdrawing groups are independently selected from the group consisting of fluorine, chlorine, bromine and CN.

In a further embodiment, the total number of electron withdrawing groups in the p-type dopant material which is an organic, a metal-organic or an organo-metallic compound may be equal to or higher than 4.

In one further embodiment the n-type dopant material is selected from the group consisting of metals, metal salts, metal complexes and mixtures thereof.

In one embodiment the metal is selected from the group consisting of alkali metals, alkaline earth metals, transition metals and mixtures thereof.

In one further embodiment the transition metal is selected from rare earth metals.

In a further embodiment the metal salt is selected from the group consisting of alkali metal salts, alkaline earth metal salts, rare earth metal salts and mixtures thereof.

In one further embodiment the alkali metal salt is selected from the group consisting of LIF, LiCl, LiBr, LiI and mixtures thereof, alternatively is LiF.

In one embodiment the metal complex is an organic alkali metal complex, alternatively an alkali metal complex, alternatively LiQ, an alkali borate or a mixture thereof.

In one further embodiment the thickness of the at least one dopant layer is from 0.1 to 25 nm, alternatively from 0.1 to 10 nm, alternatively from 0.1 to 5 nm, alternatively from 0.1 to 3 nm.

In a further embodiment the at least one dopant layer is a self-assembled monolayer.

Finally, the object is achieved by a solar panel comprising the solar cell as defined herein.

In the following details as to the layers and the materials thereof which may be used in accordance with the invention will be described.

p-Type Dopant

In accordance with the invention, the p-type dopant (=p-type dopant material) may be an organic compound, a metal-organic compound or an organo-metallic compound. It may be preferred that the amount of electron withdrawing groups in the organic compound (respectively the organo-metallic compound) is from 17 to 90 atomic percent, wherein electron withdrawing groups in this regard are preferably independently selected from the group consisting of fluorine, chlorine, bromine and CN.

In the specification the amount of electron withdrawing groups in the sum formula of a p-type dopant is given in atomic percent (at %) of electron withdrawing groups of the total number of atoms in the sum formula.

For clarity of definition and calculation, the sum formula is simplified in a way that one electron withdrawing group is counted as one atomic unit even if it consists of more than one atom.

According to the invention an electron withdrawing group is defined to be selected from the group of fluorine, chlorine, bromine and/or CN only.

The atomic percent of electron withdrawing groups is the percentage of electron withdrawing groups with respect to the total number of atoms and electron withdrawing groups in the sum formula of the p-type dopant.

The total number of atoms and electron withdrawing groups in the p-type dopant is equal to or higher than 4.

The CN-group is counted as one electron withdrawing group in the (simplified) sum formula of the p-type dopant.

The amount of electron withdrawing groups calculated for a charge transport material is shown in Table 1.

TABLE 1

| Compound Name | Simplified sum formula (electron withdrawing groups in brackets) | Total number of atoms and electron withdrawing groups in the simplified sum formula [A] | Number of electron withdrawing groups in the simplified sum formula [B] | Atomic % of electron withdrawing groups in p-type dopant (at % EWG = [B] * 100%/[A] |
|---|---|---|---|---|
| N4,N4''-bis(3,5-bis(trifluoromethyl)phenyl)-N4,N4''-di(naphthalen-2-yl)-[1,1':4',1''-terphenyl]-4,4''-diamine (example for organic charge transport material) | C54H32N2(F)12 | 100 | 12 | 100% × 12/ 100 = 12% |

The amount of electron withdrawing groups calculated for a p-type dopants are shown in Table 2.

about −0.20 V and less negative than about −1.00 V, when measured under the same conditions by cyclic voltametry

TABLE 2

| p-type Dopant | Simplified sum formula (electron withdrawing groups in brackets) | Total number of atoms and electron withdrawing groups in the simplified sum formula [A] | Number of electron withdrawing groups in the simplified sum formula [B] | Atomic % of electron withdrawing groups in p-type dopant (at % EWG = [B] * 100%/[A] |
|---|---|---|---|---|
| P1 | C12N6(CN)6 | 24 | 6 | 25.00 |
| P2 | C8(F)4(CN)4 | 16 | 8 | 50.00 |
| P3 | C6N2(F)4(CN)2 | 14 | 6 | 42.86 |
| P4 | C6N2(Cl)2(CN)2 | 12 | 4 | 33.33 |
| P5 | C6N2(F)2(Cl)2(CN)2 | 14 | 6 | 42.86 |
| P6 | C10N2(F)6(CN)2 | 20 | 8 | 40.00 |
| P7 | C10O2S4(CN)4 | 20 | 4 | 20.00 |
| P8 | C12(F)6(CN)4 | 22 | 10 | 45.45 |
| P9 | C8(F)2(Br)2(CN)4 | 16 | 8 | 50.00 |
| P10 | C20(F)10(CN)6 | 36 | 16 | 44.44 |
| P11 | C24(F)12(CN)6 | 42 | 18 | 42.86 |
| P12 | C27(F)15(Cl)6(CN)3 | 51 | 24 | 47.06 |
| P13 | C24(F)15(CN)3 | 42 | 18 | 42.86 |
| P14 | C42(F)27(CN)3 | 72 | 30 | 41.67 |
| P15 | C27(F)21(CN)3 | 51 | 24 | 47.06 |
| P16 | C21N3(F)12(CN)3 | 39 | 15 | 38.46 |
| P17 | C24(F)9(CN)6 | 39 | 15 | 38.46 |
| P18 | C30(F)27(CN)3 | 60 | 30 | 50.00 |
| P19 | C24H27CoN9P3(F)18 | 82 | 18 | 21.95 |
| P20 | C12MoS6(F)18 | 37 | 18 | 48.65 |
| P21 | C60(F)48 | 108 | 48 | 44.44 |
| P22 | C15N12(CN)6 | 33 | 6 | 18.18 |
| P23 | C24O4N2(F)16 | 46 | 16 | 34.78 |
| P24 | C14N6(F)12(CN)2 | 34 | 14 | 41.18 |
| P25 | C24BM(F)20 | 46 | 20 | 43.48 |
| P26 | C27H9Bi(F)18O6 | 61 | 18 | 29.51 |

The p-type dopant material (p-type dopant) may be an organic p-type dopant. The organic p-type dopant may have a molecular weight from about 350 to about 1700. In another embodiment, the organic p-type dopant may have a molecular weight of about 350 to 800. If the molecular weight is in this range, suitable evaporation rate may be achieved during vacuum thermal deposition.

The first reduction potential of the organic p-type dopant may be equal to or more positive compared to 2,3,5,6-Tetrafluor-7,7,8,8-tetracyanochinodimethan, which is about 0.18 V, when measured by cyclic voltametry against Fc/Fc+ in acetonitrile at room temperature.

In an embodiment the first reduction potential of the organic p-type dopant is equal or more positive than of 2,2'-(perfluoronaphthalene-2,6-diylidene) dimalononitrile, which is about 0.25 V, when measured under the same conditions by cyclic voltametry against Fc/Fc+ in acetonitrile solution at room temperature. High conductivity of the doped layer may be achieved, when the p-type dopant is selected in this range.

n-Type Dopant

The n-type dopant may be either a molecular dopant comprising an organic compound having a molecular weight of about 300 to about 1500, or may be a metal compound selected from the group consisting of a metal halide having a molecular weight of about 25 to about 500, a metal complex having a molecular weight of about 150 to about 1500, and a zero-valent metal selected from the group consisting of alkali metals, alkaline earthmetals, transition metals and rare earth metals.

In an embodiment the n-type dopant is an organic molecular dopant having a molecular weight of about 300 to about 1200.

In another embodiment the n-type dopant is a molecular dopant and the first oxidation potential is more negative than against Fc/Fc+ in dichloromethane solution at room temperature.

In a further embodiment the n-type dopant is a molecular dopant and the first oxidation potential is more negative than about −0.40 V and less negative than about −0.70 V, when measured under the same conditions by cyclic voltametry against Fc/Fc+ in dichloromethane solution at room temperature.

In a further embodiment the n-type dopant is a metal compound selected from the group of metal halide having a molecular weight of about 25 to about 250.

In a further embodiment the n-type dopant is a metal complex having a molecular weight of about 150 to about 1000.

In another embodiment the n-type dopant may be one of an alkali halide, and a metal complex selected from the group of alkali metal organic complex and main group and transition metal paddle-wheel complexes.

In a further embodiment the n-type dopant is a zero-valent metal selected from the group of Li, Na, K, Rb, Cs, Mg, Ca, Sr, Ba, Eu, Yb and Sm preferably selected from the group consisting of Li, Na, Cs, Mg, Sr, Eu, Yb and Sm.

The p-type dopants and the n-type dopants as referred to herein are essentially non-emissive.

Light Absorbing Layer

The light absorbing layer according to the disclosure comprises at least one absorber compound. The absorber compound may have a stoichiometry of $AMX_3$ or $A_2MX_4$, where "A" and "M" are cations and "X" is an anion. The "A" and "M" cations can have a variety of charges and in the original Perovskite mineral ($CaTiO_3$), the A cation is divalent and the M cation is tetravalent. The term "perovskite" as used here refers to the "perovskite crystal structure", but not limited to the specific structure of the perovskite material, $CaTiO_3$. "Perovskite" may encompass any material that has the same type of crystal structure as calcium titanium oxide, and materials in which the bivalent cation is replaced by two separate monovalent cations. The perovskite formulae as used here may include structures having three or four anions, which may be the same or different, and/or one or two organic cations, and/or metal atoms carrying two or three positive charges. Organic-inorganic perovskites are hybrid materials exhibiting combined properties of organic composites and inorganic crystallinity. The inorganic component forms a framework bound by covalent and ionic interactions, which provide high carrier mobility. The organic component helps in the self-assembly process of those materials. It also enables the hybrid materials to be deposited by low-cost technique as other organic materials. Additional important property of the organic component is to tailor the electronic properties of the organic-inorganic material by reducing its dimensionality and the electronic coupling between the inorganic sheets.

In another embodiment, A is a monovalent or bivalent cation. In another embodiment, A is selected from the group of monovalent or bivalent ammonium cations and alkali metal cations and alkaline earth metal cations.

In a further embodiment A is independently selected from organic, monovalent cations selected from primary, secondary, tertiary or quaternary organic ammonium compounds, including N-containing heteroaryl rings and ring systems, A having from 1 to 60 carbons and 1 to 20 heteroatoms; or being an organic, bivalent cation selected from primary, secondary, tertiary or quaternary organic ammonium compounds having from 1 to 60 carbons and 2 to 20 heteroatoms and having two positively charged nitrogen atoms; or being selected from the group of alkaline metals and/or alkaline earth metals.

In another embodiment A is the methyl ammonium (MA) cation $[(CH_3)_3N]^+$ or alkali metal cation or a combination thereof.

In an embodiment, M is a divalent metal cation or a trivalent metal cation. In another embodiment, M is a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$ or a trivalent metal cation selected from the group consisting of $Bi^{3+}$ and $Sb^{3+}$. In still a further embodiment, M is selected from the group consisting of $Pd^{2+}$, $Sn^{2+}$.

In an embodiment X is a monovalent anion. In another embodiment X is independently selected from $Cl^-$, $Br^-$, $I^-$, $NCS^-$, $CN^-$, and $NCO^-$. In a further embodiment, X is selected from $I^-$, $Cl^-$, and $Br$.

Further Layers

Further layers, in particular such layers containing charge transport materials, in particular hole transport materials or electron transport materials, may be contained in the one or more layer stacks of the inventive solar cell.

Hole transport materials may be triarylamine, carbazole, thiophene, phthalocyanine, diphenylhydrazone and quinoxaline. Further suitable hole transport materials are inorganic hole transport materials such as $MoX$, $V_2O_5$.

Suitable electron transport materials in line with the invention are, for example, $C_{60}$ fullerene, BCP, and compounds comprising a moiety selected from triazine, pyrazine, pyrimidine, acridine, benzoacridine, dibenzoacridine, phenanthroline, benzimidazol, carbazole, anthracene, fluorene, spiro-fluorene, phenanthrene, cyclic carboxylic imide, compounds comprising large anellated aromatic hydrocarbon ring systems with more than 14 carbon atoms in the anellated aromatic hydrocarbon ring system and truxene.

A method to determine the ionization potentials (IP) is the ultraviolet photo spectroscopy (UPS). It is usual to measure the ionization potential for solid state materials; however, it is also possible to measure the IP in the gas phase. Both values are differentiated by their solid state effects, which are, for example the polarization energy of the holes that are created during the photo ionization process. A typical value for the polarization energy is approximately 1 eV, but larger discrepancies of the values can also occur. The IP is related to onset of the photoemission spectra in the region of the large kinetic energy of the photoelectrons, i.e. the energy of the most weakly bounded electrons. A related method to UPS, the inverted photo electron spectroscopy (IPES) can be used to determine the electron affinity (EA). However, this method is less common. Electrochemical measurements in solution are an alternative to the determination of solid state oxidation ($E_{ox}$) and reduction ($E_{red}$) potential. An adequate method is, for example, cyclic voltametry. To avoid confusion, the claimed energy levels are defined in terms of comparison with reference compounds having well defined redox potentials in cyclic voltametry, when measured by a standardized procedure. A simple rule is very often used for the conversion of redox potentials into electron affinities and ionization potential: IP (in eV)=4.8 eV+e*$E_{ox}$ (wherein $E_{ox}$ is given in volts vs. ferrocenium/ferrocene ($Fc^+$/Fc)) and EA (in eV)=4.8 eV+c*$E_{red}$ ($E_{red}$ is given in volts vs. $Fc^+$/Fc) respectively (see B. W. D'Andrade, Org. Electron. 6, 11-20 (2005)), e* is the elemental charge. Conversion factors for recalculation of the electrochemical potentials in the case other reference electrodes or other reference redox pairs are known (see A. J. Bard, L. R. Faulkner, "Electrochemical Methods: Fundamentals and Applications", Wiley, 2. Ausgabe 2000). The information about the influence of the solution used can be found in N. G. Connelly et al., Chem. Rev. 96, 877 (1996). It is usual, even if not exactly correct, to use the terms "energy of the HOMO" E (HOMO) and "energy of the LUMO" E (LUMO), respectively, as synonyms for the ionization energy and electron affinity (Koopmans Theorem). It has to be taken into consideration that the ionization potentials and the electron affinities are usually reported in such a way that a larger value represents a stronger binding of a released or of an absorbed electron, respectively. The energy scale of the frontier molecular orbitals (HOMO, LUMO) is opposed to this. Therefore, in a rough approximation, the following equations are valid: $IP=-E_{(HOMO)}$ and $EA=E_{(LUMO)}$ (the zero energy is assigned to the vacuum).

For certain materials, such as hole transport materials, the ionization potential of the material may be >5.30 eV.

In case that the solar cell contains more than one stack of layers, the different stacks of layers may be separated from each other and connected with each other by interconnecting layers wherein an interconnecting layer is arranged between the first electrode and the second electrode and a first stack of layers and a second stack of layer and in direct contact with both stacks of layers. Respective interlayers and materials for forming the same are well-known from the prior art, for example WO2007/071451 A1, WO08/077615 A1 or WO2010/132236 A1.

Electrodes

In an embodiment the first electrode of the solar cell device is transparent and illumination of the solar cell is done through the first electrode. In another embodiment the second electrode of the solar cell device is transparent and illumination of the solar cell is done through the second electrode.

In a further embodiment the transparent electrode material is a thin conductive oxide (TCO).

In another embodiment the transparent electrode material is selected from the group of indium-tin-oxide (ITO), aluminum-zinc-oxide (AZO), indium-gallium-zinc-oxide (IGZO), indium-zink-oxide (IZO), molybdenum-zink-oxide (MZO) and indium-molybdenum-oxide (IMO).

In another embodiment the transparent electrode material is selected from the group of magnesium (Mg), aluminum (Al), aluminum-lithium (Al—Li), calcium (Ca), magnesium-indium (Mg—In), magnesium-silver (Mg—Ag), silver (Ag), gold (Au), or the like.

In an embodiment the first electrode is the cathode and the second electrode is the anode.

Definitions

In the present specification the following terms are defined shall be applied unless a different definition is given in the claims or elsewhere in this specification.

In the context of the present specification the term "room temperature" refers to a temperature of about 20 to about 25° C., preferably of about 22° C.

Cyclic Voltametry (CV) is an electrochemical technique which measures the current that develops in an electrochemical cell under conditions where voltage is in excess of that voltage predicted by the Nernst equation for a given compound. CV is performed by cycling the potential of a working electrode, and measuring the resulting current.

Cyclic voltametry is used to determine the first oxidation potential and the first reduction potential.

The first oxidation potential is the potential at which the investigated compound looses one electron.

The first reduction potential is the potential at which the investigated compound gains one electron.

In an embodiment the organic p-type dopant is F6-TCNNQ and the first reduction potential is about 0.25 V when measured under the same conditions by cyclic voltametry against $Fc/Fc^+$ in acetonitrile solution at room temperature.

In an embodiment the n-type dopant is the organic n-type dopant PhIm (N1,N4-bis(tri-p-tolylphosphoranylidene)benzene-1,4-diamine) and the first oxidation potential is about −0.46 V when measured under the same conditions by cyclic voltametry against Fc/Fc+ in dichloromethane solution at room temperature.

In an embodiment the light absorbing layer comprises an absorber compound of the formula $CH_3NH_3PbI_3$. This absorber compound is having a first oxidation potential comparable to the oxidation potential of TaTm when measured under the same conditions by cyclic voltametry against Fc/Fc+ in dichloromethane solution at room temperature.

As used herein, "wt %" stands for weight percentage.

As used herein, "mol %" stands for molar percentage.

All numeric values are herein assumed to be prefixed by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "does not contain" does not include impurities. Impurities have no technical effect with respect to the object achieved by the present disclosure.

The term "molecular weight" is a physical property defined as the mass of a given substance (chemical element or chemical compound) divided by the molar amount of substance (number of mols). The base SI unit for molecular weight is kg/mol. For historical reasons, molecular weights are almost always expressed in g/mol. The molecular weight may be calculated from standard atomic masses. It is the sum of all standard atomic masses in a compound. The standard atomic masses are given in the periodic table of elements. Experimentally, the molecular weight may be determined by mass spectrometry, from the vapour density, freezing-point depression or boiling point elevation.

The term "essentially non-emissive" means that the visible emission spectrum of the particular compound the term "essentially non-emissive" refers to is less than 10%, preferably less than 5%, further preferred less than 1%, relative to the visible emission spectrum. The visible emission spectrum is an emission spectrum within a wavelength range of about ≥380 nm to about ≤780 nm.

A solar cell, also photovoltaic cell, is an electrical device that converts the energy of light directly into electric energy by the photovoltaic effect, which is a physical and chemical phenomenon.

According to another aspect of the present disclosure, there is provided a method of manufacturing a solar cell, the method using deposition via vacuum thermal evaporation.

Solar cells are often referred to in prior art as a p-i-n device or a n-i-p device. The present invention describes so-called p-i-i or n-i-i devices. The terms "p-i-n", "n-i-p", "n-i-i" and "p-i-i" describe in a simplified way the layer sequence in the at least one stack of layers. "p" stands for a layer comprising or consisting of a p-type dopant. "n" stands for a layer comprising or consisting of a n-type dopant. "i" is an abbreviation for "intrinsic" and stands for a layer which does neither comprise a p-type dopant nor an n-type dopant nor does it consist of a p-type dopant nor of an n-type dopant . . .

DESCRIPTION OF EMBODIMENTS

Following, further aspects are disclosed by referring to Figures. In the figures show:

Figure 2:
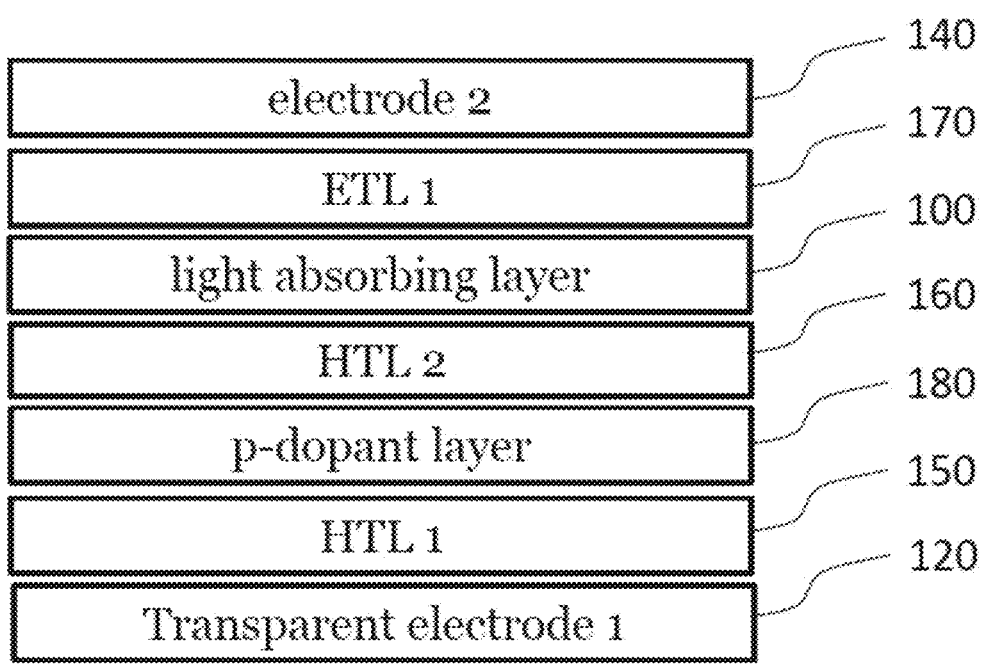
Figure 3:
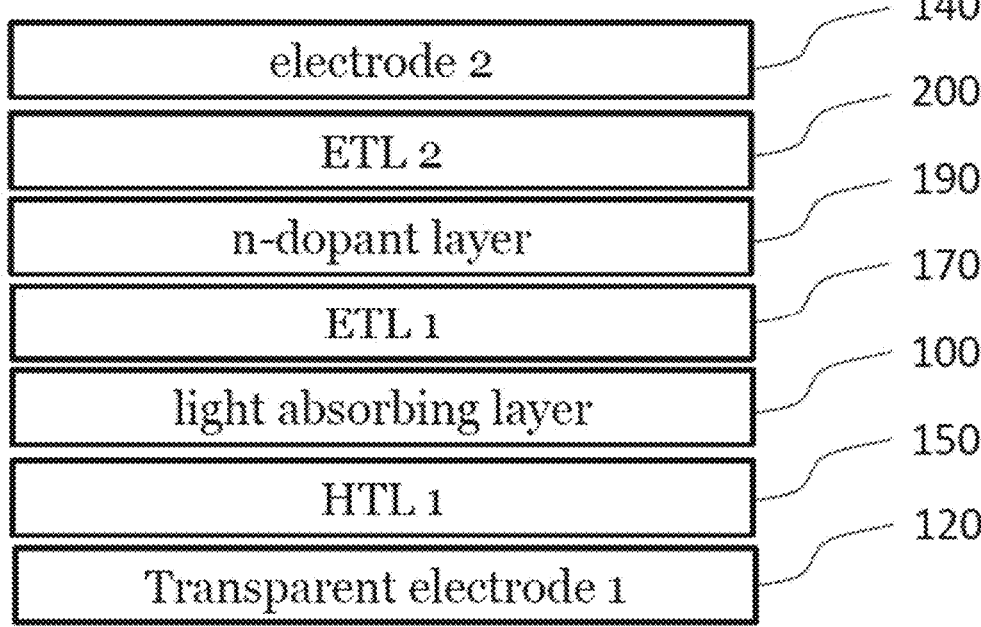
Figure 4:
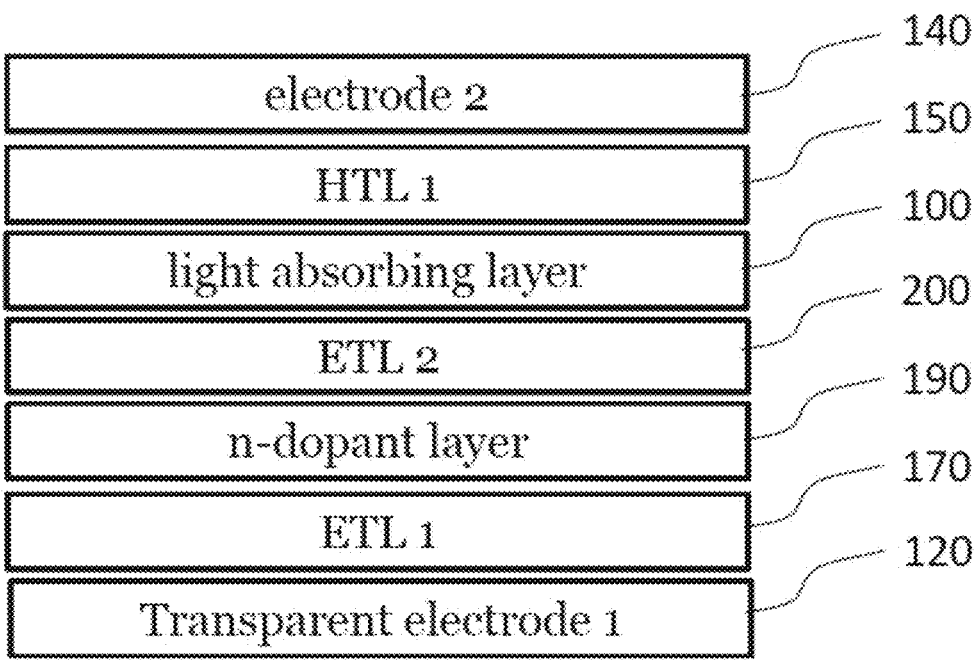
Figure 5:
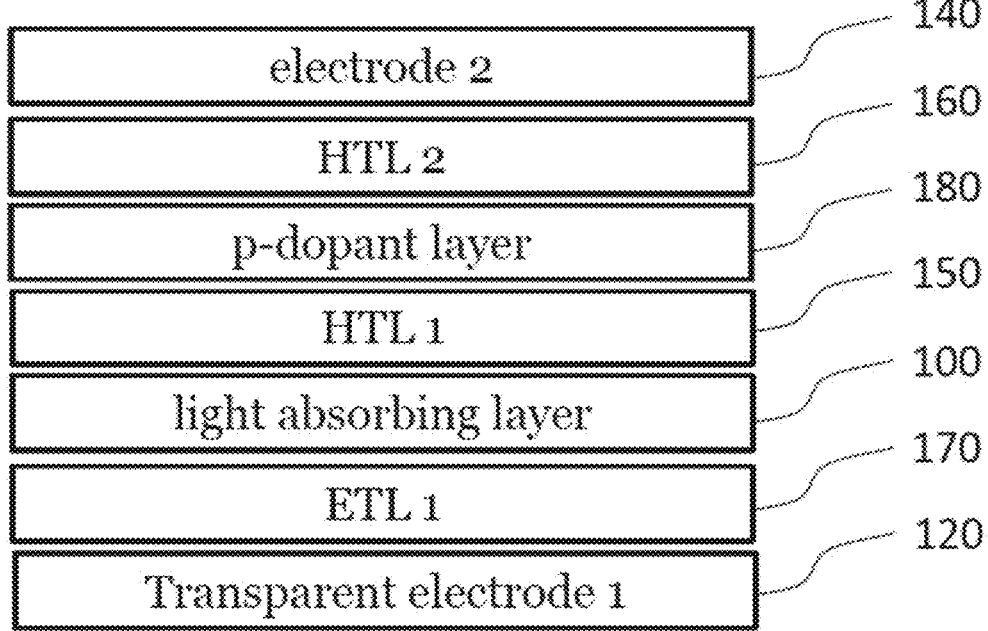
Figure 6:
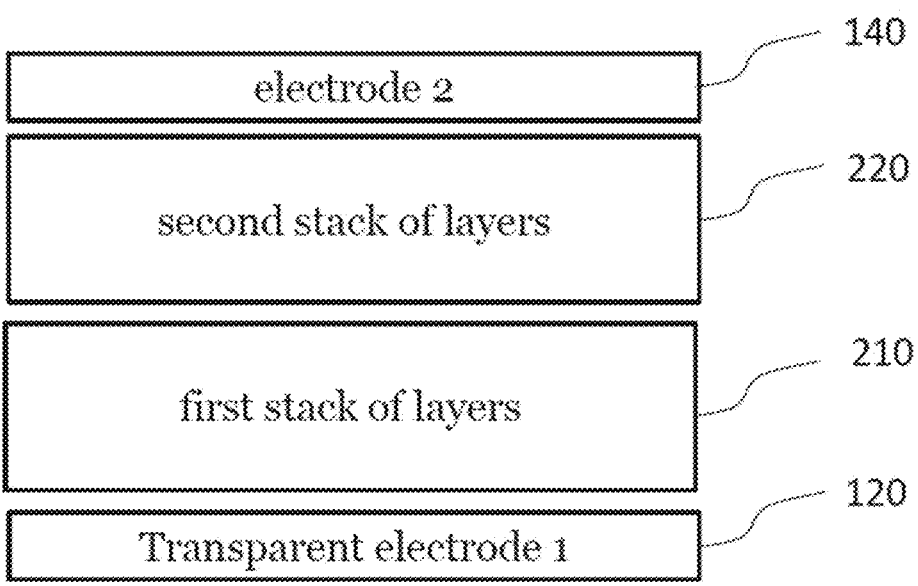
Figure 7:
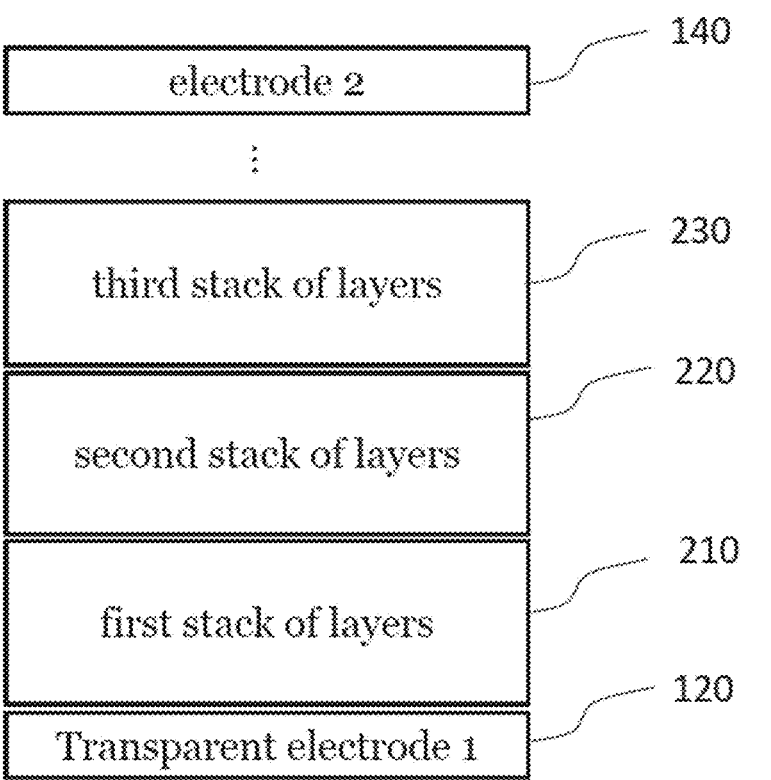
Figure 8:
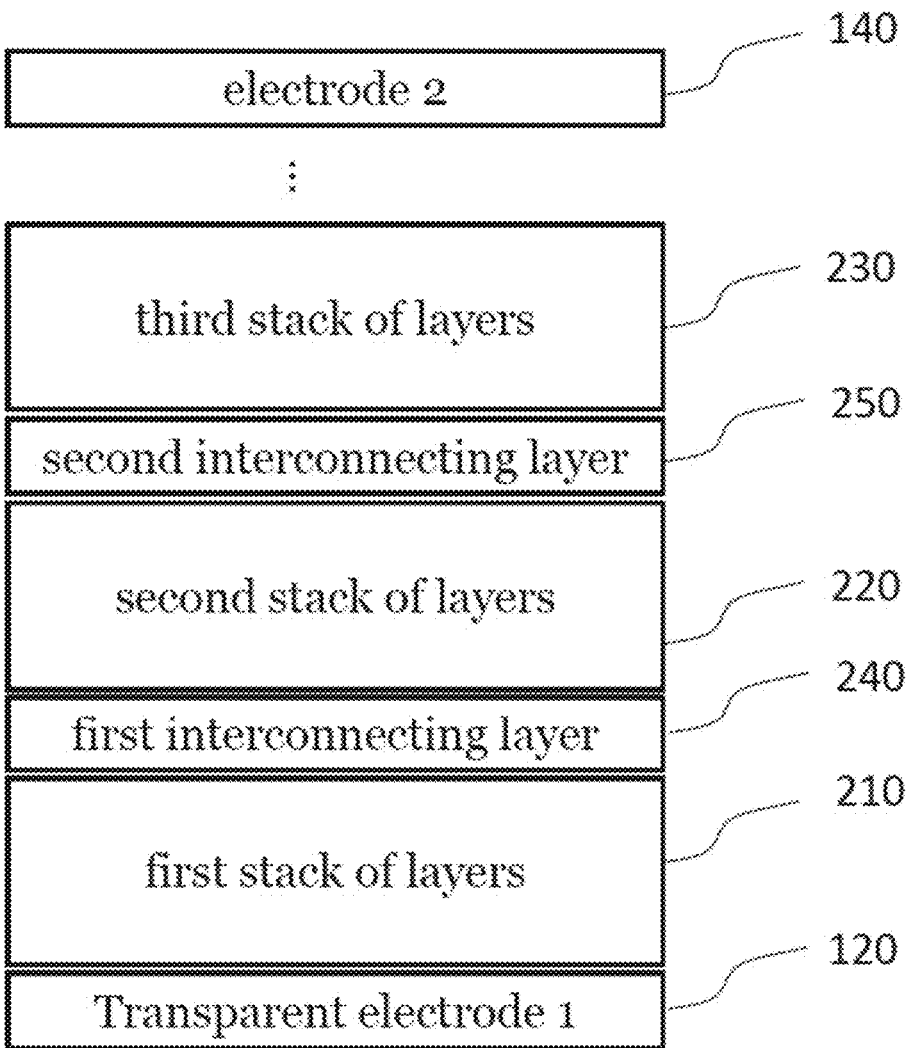

FIG. 2 a schematic representation of a solar cell in p-i-i layer sequence;

FIG. 3 a schematic representation of a solar cell in i-i-n layer sequence;

FIG. 4 a schematic representation of a solar cell in n-i-i layer sequence;

FIG. 5 a schematic representation of a solar cell in i-i-p layer sequence;

FIG. 6 a schematic representation of a solar cell provided with a first stack of layers and a second stack of layers;

FIG. 7 a schematic representation of a solar cell provided with more than two different stacks of layers; and FIG. 8 a schematic representation of a solar cell provided with more than two different stacks of layers which are interconnected by interconnecting layers.

Figure 1A:
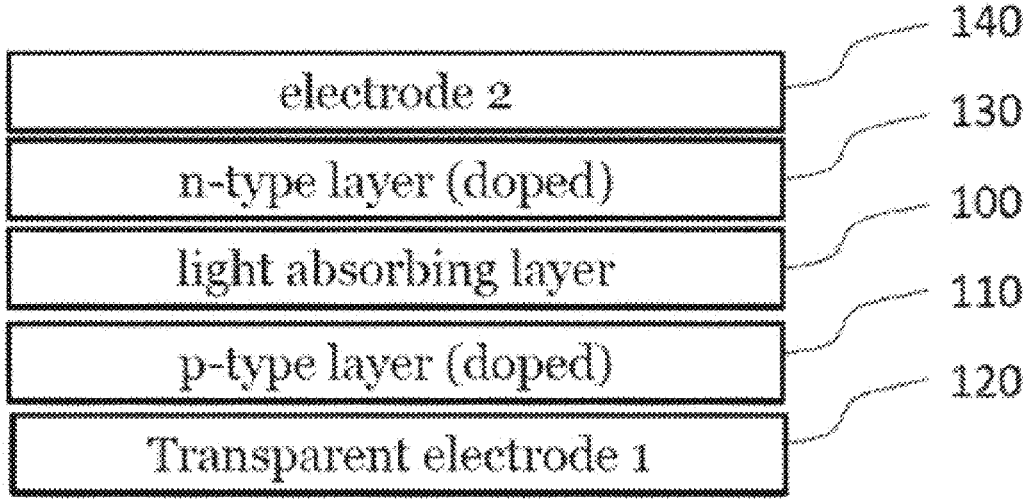
FIG. 1A is a schematic representation of a solar cell according to the prior art with p-i-n sequence.
Figure 1B:
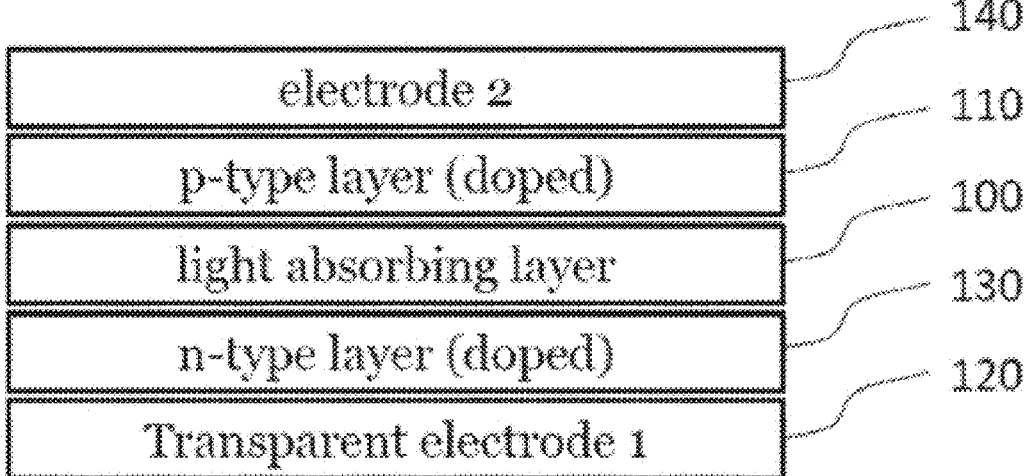
FIG. 1B is a schematic representation of a solar cell according to the prior art with n-i-p layer sequence.

FIG. 1A and FIG. 1B show a solar cell in p-i-n and n-i-p layer sequence, respectively, in accordance with the prior art. Referring to FIG. 1A the solar cell is provided with a first and a second electrode 120, 140. Between the first and the second electrode 120, 140 a light absorbing layer 100 is provided. The light absorbing layer comprises an absorber compound provided with a perovskite crystal structure. The absorber compound may have a stoichiometry of $AMX_3$, where "A" and "M" are cations and "X" is an anion. By the first and second electrode 120, 140 an anode and a cathode are implemented, thereby, a n-i-p device and a p-i-n device may be provided.

FIG. 2 shows a schematic representation of a solar cell in a p-i-i layer sequence in accordance with the present invention. The solar cell contains between the first and the second electrodes 120, 140 a stack of layers containing a first hole transport layer 150, a p-type dopant layer 180, a second hole transport layer 160, a light absorbing layer 100 and an electron transport layer 170 (forming together a stack of layers). The p-type dopant layer 180 is provided between the first electrode 120 and the light absorbing layer 110. No n-type dopant layer is provided between the light absorbing layer 100 and the second electrode 140.

FIG. 3 shows another solar cell in a i-i-n layer sequence. In this embodiment, a stack of layers which is formed by a first hole transport layer 150, a light absorbing layer 100, a first electron transport layer 170, a n-type dopant layer 190 and a second electron transport layer 200 is arranged between a first electrode 120 and a second electrode 140. In this embodiment, a n-type dopant layer (consisting of one or more n-type dopant material(s)) is arranged between the light absorbing layer 100 and the second electrode 140. In this embodiment, no p-type dopant layer is formed between the light absorbing layer 100 and the first electrode 120.

FIG. 4 shows a schematic representation of a solar cell in a n-i-i layer sequence. The solar cell contains a stack of layers comprising a first electron transport layer 170, a n-type dopant layer 190, a second electron transport layer 200, a light absorbing layer 100 and a first hole transport layer 150 which are arranged between a first electrode 120 and a second electrode 140. In this embodiment, the n-type dopant layer 190 is formed between the light absorbing layer 100 and the first electrode 120. No p-type dopant layer is formed in this embodiment between the light absorbing layer 100 and the second electrode 140.

FIG. 5 shows a further schematic representation of an embodiment of a solar cell in the i-i-p layer sequence. Again, a stack of layers is arranged between a first electrode 120 and a second electrode 140. The stack of layers in this embodiment is formed by a first electron transport layer 170, a light absorbing layer 100, a first hole transport layer 150, a p-type dopant layer 180 and a second hole transport layer 160. The p-type dopant layer 180 is arranged between the light absorbing layer 100 and the second electrode 140. No n-type dopant layer is formed in this embodiment between the light absorbing layer 100 and the first electrode 120.

FIG. 6 shows a further embodiment of the present invention wherein the solar cell comprises two different stacks of layers 210 and 220. The first stack of layer 210 is provided between and in contact with the first electrode 120 and the second stack of layer 220. The second stack of layers 220 is provided between and in contact with the first stack of layers 210 and the second electrode 140.

FIG. 7 shows a schematic representation of a solar cell comprising more than two stack of layers. In this embodiment, a variety of different stacks of layers 210, 220, 230 is arranged between the first electrode 120 and the second electrode 140 wherein the stacks of layers 210, 220, 230 are in contact with each other and with the electrodes. Each stack of layers 210, 220, 230 shown in FIG. 6 and in FIG. 7 may independently from each other be one stack of layers as shown in any of the FIGS. 2 to 5.

FIG. 8 shows a special embodiment of the solar cell shown in FIG. 7. In addition to the elements shown in FIG. 7, the solar cell according to FIG. 8 contains a first interconnecting layer 240 and a second interconnecting layer 250 connecting the first stack of layers 210 and the second stack of layers 220, respectively the second stack of layers 220 and the third stack of layers 230.

EXAMPLES

Following, experimental results with regard to the different embodiments of the solar cell shown in the Figures are described.

General Procedure for Fabrication of Vacuum-Processed Perovskite Solar Cells

Solar Cell 1 (p-i-i type) and Solar Cell 2 (n-i-i type) are prepared as follows: ITO coated glass substrates are patterned by photolithography to limit the active area of the solar cell and allow for easy contacting of the top electrode. Materials used are: p-type dopant 2,2'-(Perfluoronaphthalene-2,6-diylidene) dimalononitrile (F6-TCNNQ), the hole transport material N4,N4,N4",N4"-tetra([1,1'-biphenyl]-4-yl)-[1,1':4',1"-terphenyl]-4,4"-diamine (TaTm) and n-type dopant N1,N4-bis(tri-p-tolylphosphoranylidene)benzene-1,4-diamine (PhIm). The electron transport material is fullerene (C60). The precursor materials for the perovskite light absorbing layer are PbI2 and CH3NH3I (MAI).

With regard to characterization of the embodiments prepared, grazing incident X-ray diffraction (GIXRD) pattern are collected at room temperature on an Empyrean PANanalytical powder diffractometer using the Cu Kal radiation. Typically, three consecutive measurements are collected and averaged into single spectra. The surface morphology of the thin films is analyzed using atomic force microscopy (AFM, Multimode SPM, Veeco, USA). Scanning Electron Microscopy (SEM) images is performed on a Hitachi S-4800 microscope operating at an accelerating voltage of 2 kV over Platinum-metallized samples. Absorption spectra are collected using a fiber optics based Avantes Avaspec2048 Spectrometer.

Characterization of the solar cells is performed as follows: The external quantum efficiency (EQE) is estimated using the cell response at different wavelength (measured with a white light halogen lamp in combination with band-pass filters), where the solar spectrum mismatch is corrected using a calibrated Silicon reference cell (MiniSun simulator by ECN, the Netherlands).

The current density-voltage (J-V) characteristics are obtained using a Keithley 2400 source measure unit and under white light illumination, and the short circuit current density is corrected taking into account the device EQE. The electrical characterization was validated using a solar simulator by Abet Technologies (Model 10500 with an AM1.5G xenon lamp as the light source). Before each measurement, the exact light intensity is determined using a calibrated Si reference diode equipped with an infrared cut-off filter (KG-3, Schott). The J-V curves are recorded between −0.2 and 1.2 V with 0.01V steps, integrating the signal for 20 ms after a 10 ms delay. This corresponds to a speed of about 0.3 V s-1.

The device layout used for the solar cells configurations consists in four equal pixels (area of 0.06 cm2, defined as the overlap between the patterned ITO and the top metal contact) measured through a shadow masks with 0.01 cm2 aperture. For hysteresis study, different scan rates (0.1, 0.5 and 1 Vs-1) are used, biasing the device from –0.2 to 1.2 V with 0.01 V steps and vice versa. Light intensity dependence measurements are done by placing 0.1, 1, 10, 20, 50% neutral density filters (LOT-QuantumDesign GmbH) between the light source and the device.

Further, with regard to device preparation, ITO-coated glass substrates are subsequently cleaned with soap, water and isopropanol in an ultrasonic bath, followed by UV-ozone treatment. They are transferred to a vacuum chamber integrated into a nitrogen-filled glovebox (MBraun, H2O and O2<0.1 ppm) and evacuated to a pressure of 1·10-6 mbar. The vacuum chamber is equipped with six temperature controlled evaporation sources (Creaphys) fitted with ceramic crucibles. The sources are directed upwards with an angle of approximately 90° with respect to the bottom of the evaporator. The substrate holder to evaporation sources distance is approximately 20 cm. Three quartz crystal microbalance (QCM) sensors are used, two monitoring the deposition rate of each evaporation source and a third one close to the substrate holder monitoring the total deposition rate.

For thickness calibration, firstly the materials TaTm and F6-TCNNQ, C60 and PhIm are individually sublimed. A calibration factor is obtained by comparing the thickness inferred from the QCM sensors with that measured with a mechanical profilometer (Ambios XP1). Then these materials are co-sublimed for Comparative Examples 1 and 2 at temperatures ranging from 135-160° C. for the dopants to 250° C. for the TaTm and C60, and the evaporation rate is controlled by separate QCM sensors and adjusted to obtain the desired doping concentration. In general, the deposition rate for TaTm and C60 is kept constant at 0.8 Ås-1, while varying the deposition rate of the dopants during co-deposition. Pure dopant (F6-TCNNQ and PhIm) layers (for Solar Cell 1 and 2) and undoped TaTm and C60 layers (for all examples in Table 2) are deposited at a rate of 0.5 Ås-1.

Once the deposition on the ITO is completed, the chamber is vented with dry N2 to replace the crucibles with those containing the precursor materials for the perovskite light absorbing layer deposition, PbI2 and CH3NH3I. The vacuum chamber is evacuated again to a pressure of 10-6 mbar, and the perovskite films (light absorbing layer) are then obtained by co-deposition of the two precursors.

The calibration of the deposition rate for the CH3NH3I is difficult due to non-uniform layers and the soft nature of the material which impedes accurate thickness measurements. Hence, the source temperature of the CH3NH3I is kept constant at 70° C. and the CH3NH3I:PbI2 ratio is controlled off line using grazing incident x-ray diffraction by adjusting the PbI2 deposition temperature. The optimum deposition temperatures are 250° C. for the PbI2 and 70° C. for the CH3NH3I. After deposition of a 500 nm thick perovskite film, the chamber is vented and the crucibles replaced with those containing C60 and PhIm, and evacuated again to a pressure of 10-6 mbar. This process of exchanging crucibles is done to minimize possible cross-contamination between the organic materials and the perovskite precursors.

The solar cell devices for Comparative Example 1 are further processed by depositing a film of pure C60 and one of the n-type doped C60 layer (C60: PhIm), with thicknesses of 10 and 40 nm, respectively. Processing of Solar Cell 1 involves the sequential deposition of C60 and BCP, with thickness of 25 and 8 nm, respectively. For Solar Cell 2, the devices are processed by depositing a film of pure TaTm and one of MoO3, with thicknesses of 15 and 10 nm, respectively. Deposition of the MoO3 layout is performed in a separate vacuum chamber from an alumina-coated aluminum crucible at a deposition rate of 0.5 Ås-1.

In a single evaporation run five substrates (3 by 3 cm) are prepared, each substrate containing four cells. Generally, one substrate is reserved for a reference configuration. Finally the substrates are transferred to a second vacuum chamber where the metal electrode (100 nm thick) is deposited. For n-i-p and n-i-i devices, the same procedure as described before is used in the inverted order.

Layer stack details are given in Table 4.

The details of the layer stack in the solar cell devices are given as follows: A slash "/" separates individual layers. Layer thicknesses are given in squared brackets [ . . . ].

Technical Effect of the Invention

The solar cell devices according to the invention show improved efficiency and lifetime when compared to the solar cells of the prior art.

TABLE 3

| List of compounds used | | |
|---|---|---|
| Compound Name | IUPAC name | Reference |
| TaTm | N4,N4,N4'',N4''-tetra([1,1'-biphenyl]-4-yl)-[1,1':4',1''-terphenyl]-4,4''-diamine (TaTm) CAS 952431-34-4 | WO2011134458A1 |
| F6-TCNNQ | 2,2'-(Perfluoronaphthalene-2,6-diylidene) dimalononitrile (F6-TCNNQ) CAS 912482-15-6 | US2005121667A1 US2005139810A1 |
| MAPI | MAPbI3 prepared in-situ from precursor materials PbI2 and CH3NH3I (MAI) | |
| PhIm | N1,N4-bis(tri-p-tolylphosphoranyl-idene)benzene-1,4-diamine (PhIm) CAS 51870-56-5 | WO2012175219A1 |
| C60 | Fullerene-C60 CAS 99685-96-8 | Reed, Bolskar, Chem. Rev. 100, 1075 (2000) |
| BCP | 2,9-dimethyl-4,7-diphenyl-1,10-phenanthroline (BCP) CAS 4733-39-5 | |

TABLE 4

| Overview of layer stack of inventive Solar Cell 1, Solar Cell 2, Comparative Example 1 | | |
|---|---|---|
| Cell name | Cell Type | Layer Stack |
| Solar Cell 1 | p-i-i | ITO/F6-TCNNQ[2.5 nm]/TaTm[10 nm]/MAPI[500 nm]/C60[25 nm]/BCP [8 nm]/Ag |
| Solar Cell 2 | n-i-i | ITO/PhIm [2 nm]/C60 [10 nm]/MAPI[500 nm]/TaTm [15 nm]/MoO3 [10 nm]/Au |
| Comparative Example 1 | p-i-n | ITO/TaTm:F6-TCNNQ[40 nm]/TaTm[10 nm]/MAPI [500 nm]/C60[10 nm]/C60:PhIm [40 nm]/Ag |

TABLE 5

| | $V_{OC}$ (mV) | $J_{SC}$ (mA cm$^{-2}$) | FF (%) | PCE (%) | LT PCE after 250 h (%) |
|---|---|---|---|---|---|
| Performance of inventive Solar Cell 1 and Solar Cell 2 in comparison to prior art solar cell (Comparative Example 1) | | | | | |
| Solar Cell 1 | 1059 | 21.3 | 80.4 | 18.2 | 94 |
| Solar Cell 2 | 1128 | 21.2 | 74.8 | 17.9 | — |
| Comparative Example 1 | 1076 | 20.8 | 72.5 | 16.2 | 62 |

For comparison of the performance of different solar cells four parameters are selected, which are defined as follows (source: www.pveducation.org):

1) Open circuit voltage (Voc) in mV—maximum voltage available from a solar cell, and this occurs at zero current 2) Short circuit current (Jsc) in mA cm$^{-2}$—current through the solar cell when the voltage across the solar cell is zero (i.e., when the solar cell is short circuited). This is the largest current which may be drawn from the solar cell.

3) At both of these operating points, Voc and Jsc, the power from the solar cell is zero. The "fill factor" (FF) in %, is a parameter which, in conjunction with Voc and Isc, determines the maximum power from a solar cell. The FF is defined as the ratio of the maximum power from the solar cell to the product of Voc and Isc. Graphically, the FF is a measure of the "squareness" of the solar cell and is also the area of the largest rectangle which will fit in the IV curve.

4) Power conversion efficiency (PCE) in %—ratio of energy output from the solar cell to input energy from the sun. PCE=Voc*Jsc*FF The features disclosed in this specification, the figures and/or the claims may be material for the realization of various embodiments, taken in isolation or in various combinations thereof.

The invention claimed is:

1. A solar cell comprising:
a) a first electrode having a first surface and a second surface opposite the first surface;
b) a second electrode having a first surface and a second surface opposite the first surface; and
c) a first stack of layers provided between and in direct contact with the first surface or the second surface of the first electrode and the second electrode or the first surface, respectively, of the second electrode;
wherein the first stack of layers comprises
(c1) one light absorbing layer provided with a perovskite crystal structure; and
(c2) a dopant layer, wherein the dopant layer consists of an n-type dopant material(s),
the first stack of layers comprises only n-type dopant layers and does not comprise p-type dopant layers;
the dopant layer is arranged between the first electrode and the light absorbing layer.

2. The solar cell according to claim 1, wherein the solar cell comprises two or more layer stacks and optionally at least one interconnecting layer, wherein the two or more layer stacks comprises the first stack of layers, and wherein the interconnecting layer is arranged between two of the two or more layer stacks.

3. The solar cell according to claim 1, wherein the n-type dopant material(s) is selected from the group consisting of metals, metal salts, metal complexes, and mixtures thereof.

4. The solar cell according to claim 3, wherein the metal is selected from the group consisting of alkali metals, alkaline earth metals, transition metals, rare earth metals, and mixtures thereof.

5. The solar cell according to claim 3, wherein the metal is selected from Li, Na, K, Rb, Cs, Mg, Ca, Sr, Ba, Sm, Eu, or Yb.

6. The solar cell according to claim 3, wherein the metal is selected from Li, Na, Cs, Mg, Sr, Yb, Eu, or Sm.

7. The solar cell according to claim 3, wherein the metal salt is selected from the group consisting of alkali metal salts, alkaline earth metal salts, rare earth metal salts, and mixtures thereof.

8. The solar cell according to claim 7, wherein the alkali metal salt is selected from the group consisting of LiF, LiCl, LiBr, Lil, and mixtures thereof.

9. The solar cell according to claim 7, wherein the alkali metal salt is LiF.

10. The solar cell according to claim 3, wherein the metal complex is an organic alkali metal complex.

11. The solar cell according to claim 1, wherein a thickness of the dopant layer is from 0.1 to 25 nm.

12. The solar cell according to claim 1, wherein the dopant layer is a self-assembled monolayer.

13. A solar panel comprising the solar cell according to claim 1.

* * * * *